US005771304A

United States Patent [19]

Van Den Thillart et al.

[11] Patent Number: 5,771,304

[45] Date of Patent: Jun. 23, 1998

[54] APPARATUS INCLUDING A LOUDSPEAKER UNIT, LOUDSPEAKER UNIT, AND HOUSING FOR A LOUDSPEAKER UNIT

[75] Inventors: Martinus P. M. Van Den Thillart; Wilhelmus H. M. M. Evers; Johannes A. A. Das, all of Eindhoven, Netherlands; Dirk De Boe; Raoul E. M. Keereman, both of Dendermonde, Belgium

[73] Assignee: U.S. Philips Corporation, New York, N.Y.

[21] Appl. No.: 510,398

[22] Filed: Aug. 2, 1995

[30] Foreign Application Priority Data

Aug. 2, 1994 [EP] European Pat. Off. .............. 94202232

[51] Int. Cl.[6] ............................ H04R 25/00; H05K 5/00; A47B 81/06

[52] U.S. Cl. ............................ 381/188; 381/205; 381/24; 381/88; 181/199; 181/148; 181/156

[58] Field of Search .................................... 381/188, 205, 381/90, 87, 88, 24; 181/145, 148, 156, 198, 199

[56] References Cited

U.S. PATENT DOCUMENTS

| | | | |
|---|---|---|---|
| 3,104,729 | 9/1963 | Olson | 381/24 |
| 4,112,256 | 9/1978 | Carlsson | 381/24 |
| 4,509,615 | 4/1985 | Hruby | 181/148 |
| 5,278,361 | 1/1994 | Field | 181/145 |
| 5,359,664 | 10/1994 | Steuben | 381/88 |

FOREIGN PATENT DOCUMENTS

| | | |
|---|---|---|
| 0040281 | 11/1981 | European Pat. Off. . |
| 0575895 | 12/1993 | European Pat. Off. . |

*Primary Examiner*—Sinh Tran
*Attorney, Agent, or Firm*—Leroy Eason

[57] ABSTRACT

A television receiver has a subwoofer box situated inside the cabinet of the television receiver. The subwoofer box has a loudspeaker arranged in a chamber and mounted in such a manner that it is situated outside the space enclosed by the subwoofer box. The chamber is dimensioned so as to accommodate the loudspeaker. This enables the volume of the subwoofer box to be optimized in view of the space available inside the cabinet of the television receiver. Moreover, mounting of the loudspeaker and the wiring thereof is simplified considerably.

6 Claims, 2 Drawing Sheets

APPARATUS INCLUDING A LOUDSPEAKER UNIT, LOUDSPEAKER UNIT, AND HOUSING FOR A LOUDSPEAKER UNIT

BACKGROUND OF THE INVENTION

This invention relates to an apparatus including a loudspeaker unit comprising a housing having walls which enclose a continuous space, of which a first wall has an opening and at its outer side, which is remote from the space, has a mounting surface around the opening, and a loudspeaker mounted on the mounting surface in such a way that it is situated outside the space and closes the opening.

Such an apparatus is known from EP-A-0,342,117. The known apparatus is a television receiver having a loudspeaker unit arranged inside the cabinet of the television receiver. The loudspeaker unit comprises a housing and a loudspeaker, the loudspeaker being mounted on the outer surface of a flat wall of the housing in a manner such that it wholly projects from this wall. A disadvantage of the known apparatus is that the reproduction of low frequency sounds by the loudspeaker unit is limited.

SUMMARY OF THE INVENTION

It is an object of the invention to improve an apparatus of the type defmed in the opening paragraph so as to enhance low-frequency sound reproduction.

To this end the apparatus in accordance with the invention is characterised in that the mounting surface is situated in a chamber formed by a projecting portion of the first wall, which portion projects towards the space, and in that the chamber is dimensioned in such a manner that at least a substantial part of the loudspeaker is situated in the chamber. By means of these measures the space inside the apparatus is utilised to maximise the volume of the space enclosed by the housing of the loudspeaker unit. Maximising the volume provides improved low-frequency sound reproduction.

An embodiment of the apparatus in accordance with the invention is characterised in that the dimension of the chamber in a direction perpendicular to the first wall corresponds to the dimension of the loudspeaker in this direction. As a result of this measure the chamber in the housing is just deep enough to accommodate the loudspeaker, so that the first wall can adjoin a flat wall in the apparatus.

An embodiment of the apparatus in accordance with the invention is characterised in that the mounting surface adjoins a second wall of the housing, which second wall adjoins the first wall. This measure provides better access to the loudspeaker for wiring purposes. It also reduces acoustic resonances which may occur because the loudspeaker is situated in a chamber. These resonances are annoying because they give rise to so-called coloration of the radiated sound.

An embodiment of the apparatus in accordance with the invention is characterised in that the mounting surface adjoins a third wall of the housing, which third wall adjoins the first wall and the second wall. This measure effectively precludes acoustic resonances in the chamber and, as a consequence, coloration of the sound.

The invention will be described in more detail, by way of example, with reference to the drawings.

It is to be noted that the embodiments are shown diagrammatically and the Figures are shown to an arbitrary scale, which is not always the same.

DESCRIPTION OF THE PREFERRED EMBODIMENT

Figure 1:
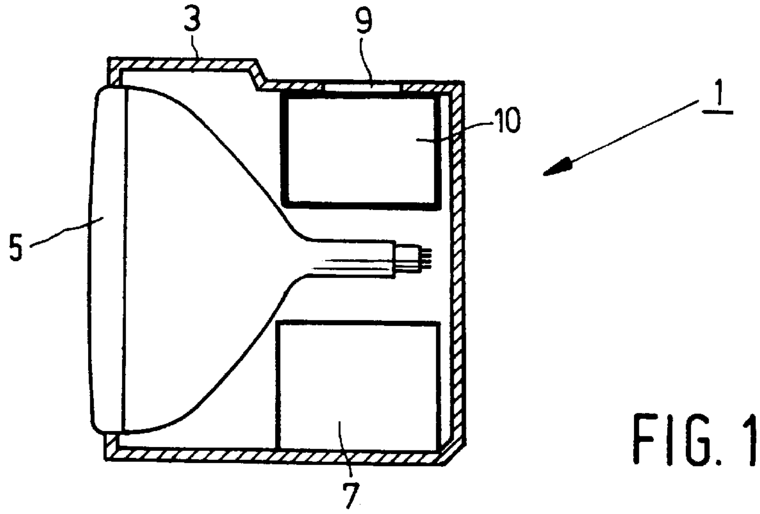
FIG. 1 is a sectional view showing an embodiment of the apparatus in accordance with the invention.

FIG. 1 shows an apparatus in accordance with the invention, in the present case a television receiver 1. The television receiver 1 comprises a cabinet 3, a picture tube 5, electronic circuitry 7, and a loudspeaker unit 10. The loudspeaker unit 10 is accommodated wholly inside the cabinet 3 and radiates its sound into the interior of the television receiver 1. The cabinet 3 has apertures 9 through which the sound can emerge from the cabinet 3. The loudspeaker unit 10 is adapted to reproduce low frequency. For these low frequencies the loudspeaker unit 10 behaves as a point source. This means that the sound readily propagates in all directions via the apertures 9. Therefore, it is not a problem that the loudspeaker unit 10 is situated inside the cabinet 3.

Figure 2:
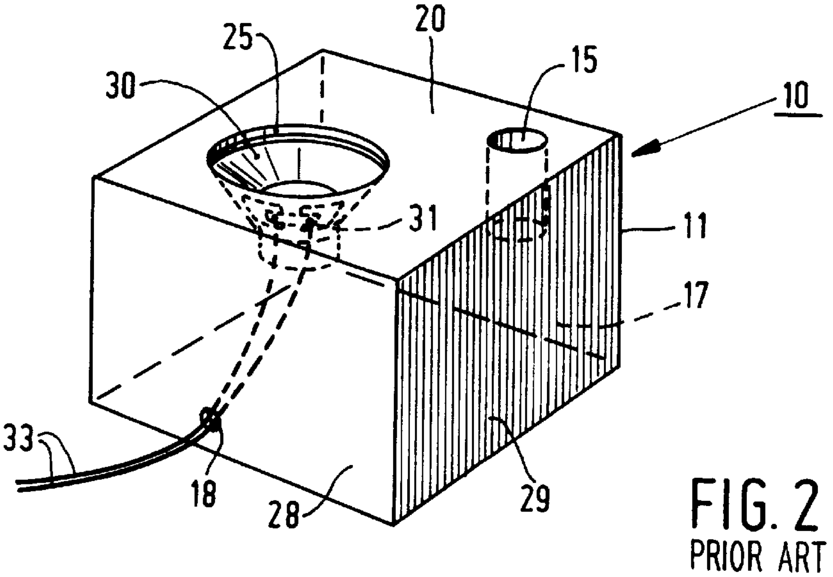
FIG. 2 PRIOR ART
FIG. 2 is a perspective view showing a known loudspeaker unit suitable for low-frequency reproduction.

FIG. 2 shows a known loudspeaker unit 10 comprising a loudspeaker 30 and a housing 11. The housing 11 comprises a plurality of walls 20, 28 and 29 which enclose a space 17. The first wall 20 has an opening 25 and at its inner side around the opening 25 the first wall has a mounting surface (not shown) on which the loudspeaker 30 is mounted. The loudspeaker 30 is arranged so as to be situated wholly inside the space 17. The loudspeaker unit 10 has a port 15 which serves as a so-called bass-reflex port for improved low-frequency reproduction. The loudspeaker 30 has electrical connection terminals 31 situated inside the space 17. The loudspeaker 30 is driven by means of a wiring 33 connected to the terminals 31. As a result, the wiring is situated partly inside the space 17 and should be led out through a lead-through opening 18. Installing the wiring 30 in this manner is laborious. Moreover, the lead-through opening 18 should be sealed thoroughly in order to preclude “hissing”. This hissing is caused by air being forced through the opening 18 with a high velocity when the loudspeaker 30 is in operation.

Figure 3:
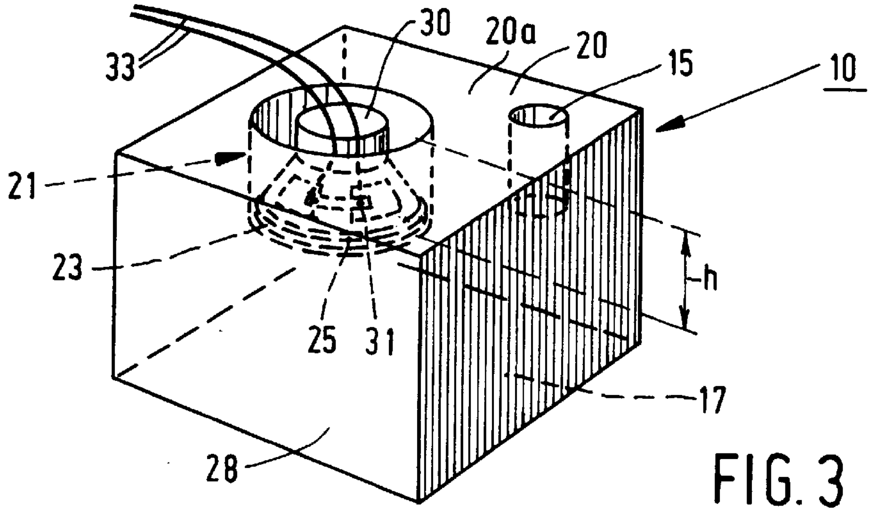
FIG. 3 is a perspective view showing an embodiment of a loudspeaker unit for the apparatus in accordance with the invention.

FIG. 3 shows an embodiment of the loudspeaker unit 10 in accordance with the invention. In this embodiment the loudspeaker 30 is mounted on a mounting surface 23 at an outer side 20a of the first wall 20 in such a manner that the loudspeaker is situated outside the space 17. The mounting surface 23 is situated in a chamber 21 formed by a projecting portion of the first wall 20, which portion is directed towards the space 17. The chamber 21 is dimensioned in such a manner that at least a substantial part of the loudspeaker 30 is situated in the chamber 21. Preferably, the dimension h of the chamber 21 in a direction perpendicular to the first wall 20 corresponds to the dimension of the loudspeaker 30 in this direction. As a result of this, the chamber 21 is just large enough to accommodate the loudspeaker 30 completely. This makes it possible to place the loudspeaker unit 10 against a flat wall of the cabinet 3 in the television receiver, so that the space inside the cabinet 3 can be utilised to an optimum extent in order to obtain a maximal volume of the space 17, which enhances low-frequency sound reproduction. Mounting the loudspeaker 30 outside the space 17 has the advantage that the wiring 33 need not be led through a wall of the housing 11. Another advantage is that the loudspeaker 30 can be isolated simply from the housing 11. This is of particular importance in order to enable different materials to be separated simply when the loudspeaker unit 10 is to be processed as waste after its service life.

Figure 4:
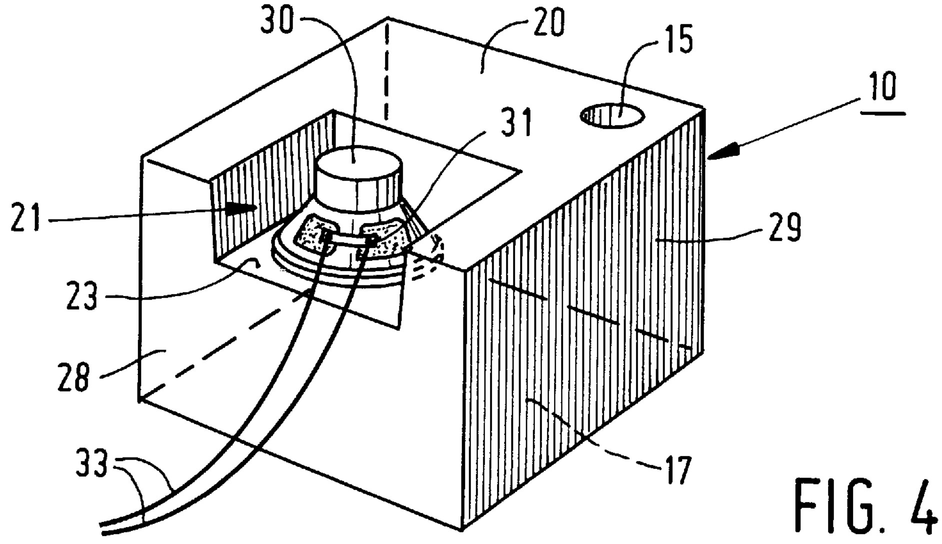
FIG. 4 is a perspective view showing a further embodiment of the loudspeaker unit for the apparatus in accordance with the invention.

FIG. 4 shows a further embodiment of the loudspeaker unit 10 in accordance with the invention. In this embodiment the mounting surface 23 adjoins a second wall 28. As a result, the chamber 21 is accessible from two sides. An advantage of this embodiment is that the wiring 33 can be connected more simply to the connection terminals 31 of the loudspeaker 30 because the terminals 31 are readily accessible. This enables connection to be effected after mounting of the loudspeaker 30, for example, when the complete loudspeaker unit 10 is mounted in the television receiver 1.

Figure 5:
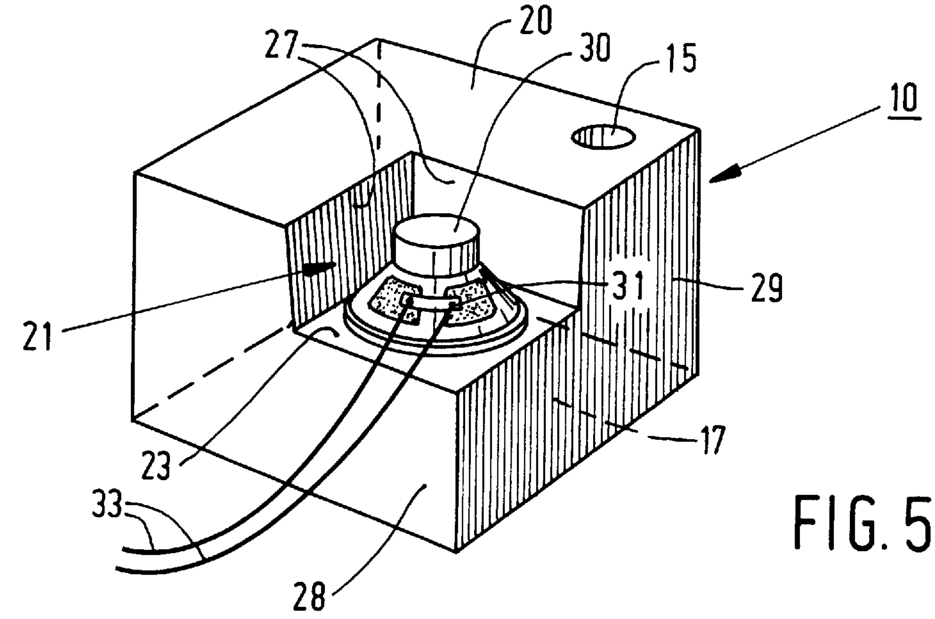
FIG. 5 is a perspective view showing yet another embodiment of the loudspeaker unit for the apparatus in accordance with the invention.

FIG. 5 shows a further embodiment of the loudspeaker unit 10 in accordance with the invention. In this embodiment the mounting surface 23 adjoins the second wall 28 and a third wall 29, which walls adjoin one another and both adjoin the first wall 20. An advantage of this embodiment is that the chamber 21 no longer forms an acoustic space in which undesired resonances can occur because the side walls 27 do not face one another. This precludes coloration of the sound. In this embodiment the inverted mounting of the loudspeaker 30 will attenuate mid-frequency reproduction. This is advantageous because the television receiver 1 often has separate loudspeakers for mid-range and high frequencies. In that case the mid-frequency reproduction by the loudspeaker unit 10 could interfere in an undesirable manner with the mid-frequency reproduction by these separate loudspeakers.

It is to be noted that the invention is not limited to the exemplary embodiments shown herein. Various other embodiments are possible without departing from the scope of the invention. For example, the mounting surface 23 may be inclined relative to the first wall 20 for a further maximisation of the volume of the space 17. Moreover, the shape of the housing 11 can be further adapted to the space available in the apparatus 1. Besides, the apparatus in accordance with the invention may, for example, also be a monitor or an audio apparatus.

We claim:

1. A housing for a loudspeaker unit, said housing having a plurality of outer walls enclosing a continuous space, a first of said walls having an opening therethrough and a loudspeaker mounting surface around the opening; and wherein:

said first wall has a projection portion which projects towards the continuous space and forms a chamber wherein a loudspeaker is mounted on said mounting surface facing the continuous space;

said loudspeaker mounting surface is situated in said chamber on an outer side of said first wall remote form said continuous space;

said plurality of walls includes a second wall which adjoins said first wall, and the mounting surface adjoins said second wall; and said first wall further includes a bass reflex port.

2. A housing as claimed in claim 1, wherein said plurality of walls includes a third wall which adjoins said first wall and said second wall, and the mounting surface adjoins said third wall.

3. A housing as claimed in claim 1, wherein the chamber has a dimension h in a direction perpendicular to said first wall, the dimension h corresponding to the dimension of the loudspeaker in said direction.

4. A housing as claimed in claim 1 wherein said bass reflex port is situated in a plane of said first wall parallel to said mounting surface and spaced apart therefrom.

5. An apparatus including a loudspeaker unit and a cabinet in which the loudspeaker unit is located, the loudspeaker unit comprising:

a housing having a plurality of walls enclosing a continuous space, a first of said walls having an opening therethrough and a mounting surface around the opening, and a loudspeaker mounted on said mounting surface such that the loudspeaker closes the opening;

and wherein:

said first wall has an outermost surface in a plane parallel to said mounting surface and further has a projecting portion which projects toward the continuous space and forms a chamber;

the mounting surface is situated in said chamber on an outer side of said first wall remote from said space;

the loudspeaker is mounted on said mounting surface such that the loudspeaker is outside and facing the continuous space;

said plurality of walls includes a second wall which adjoins said first wall, and further includes a third wall which adjoins both said first wall and said second wall;

the mounting surface adjoins both said second wall and said third wall; and the chamber has a dimension h in a direction perpendicular to the first wall, the dimension h corresponding to the dimension of the loudspeaker in said direction.

6. An apparatus including a loudspeaker unit which comprises:

a housing have a plurality of walls enclosing a continuous space, a first of said walls having a projecting portion which projects towards the continuous space so as to form a chamber outside the continuous space, said first wall portion having an opening therethrough and a mounting surface around the opening and situated in the chamber on an outer side of the first wall portion remote from the continuous space;

the chamber having a first open side opposite to the mounting surface, a second open side adjoining the mounting surface, and a third open side adjoining the mounting surface and the first open side; and a loudspeaker facing the continuous space and mounted on the mounting surface such that the loudspeaker closes said opening and at least a substantial portion thereof is disposed in the chamber.

* * * * *